United States Patent [19]

Staudinger et al.

[11] Patent Number: 5,416,356
[45] Date of Patent: May 16, 1995

[54] INTEGRATED CIRCUIT HAVING PASSIVE CIRCUIT ELEMENTS

[75] Inventors: Joseph Staudinger, Gilbert; Warren L. Seely, Chandler; Howard W. Patterson, Phoenix, all of Ariz.

[73] Assignee: Motorola, Inc., Schaumburg, Ill.

[21] Appl. No.: 115,833

[22] Filed: Sep. 3, 1993

[51] Int. Cl.⁶ ............................................. H01L 27/02
[52] U.S. Cl. .................................... 257/531; 257/535
[58] Field of Search ............... 257/531, 488, 533, 535, 257/536, 532, 534

[56] References Cited

U.S. PATENT DOCUMENTS

| | | | |
|---|---|---|---|
| 3,138,744 | 6/1964 | Kilby | 257/535 |
| 3,675,091 | 7/1972 | Naomoto et al. | 257/488 |
| 4,801,883 | 1/1989 | Muller et al. | 257/531 |
| 4,839,712 | 6/1989 | Mamodaly et al. | 257/531 |
| 4,969,032 | 11/1990 | Scheitlin et al. | 257/531 |
| 5,177,381 | 1/1993 | Friesen et al. | |
| 5,223,735 | 6/1993 | Kinoshita et al. | 257/488 |
| 5,283,462 | 2/1994 | Stengel | 257/531 |

FOREIGN PATENT DOCUMENTS

| | | | |
|---|---|---|---|
| 53-38274 | 4/1978 | Japan | 257/531 |
| 62-36395 | 8/1987 | Japan | 257/533 |
| 63-140560 | 6/1988 | Japan | 257/531 |
| 3-89548 | 4/1991 | Japan | 257/531 |

OTHER PUBLICATIONS

"Programmable Substrate Inductor," *IBM Technical Disclosure Bulletin*, vol. 32, No. 6B, Nov. 1989, pp. 310–317.

*Primary Examiner*—Andrew J. James
*Assistant Examiner*—Courtney A. Bowers
*Attorney, Agent, or Firm*—Rennie William Dover

[57] ABSTRACT

An integrated circuit is formed from a first layer of conductive material (30) which is separated from a second layer of conductive material (39) by a layer of dielectric material (36). The first layer of conductive material (30) is patterned to form a first plate (32, 59) of a capacitor (22, 50, 62, 72). An electrical interconnect (33, 63) is formed within the first plate (32, 59), respectively. A via (37) is formed in the layer of dielectric material (36). A second layer of conductive material (39) is patterned to form a second plate (42, 56, 66, 76) of the capacitor (22, 50, 62, 72) and a planar spiral inductor (21, 51, 61, 71). The planar spiral inductor (21, 51, 61, 71) is surrounded by the second plate (42, 56, 66, 76) of the capacitor (22, 50, 62, 72).

7 Claims, 11 Drawing Sheets

- *PRIOR ART* -

- *PRIOR ART* -

- *PRIOR ART* -

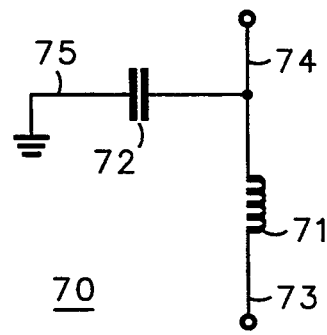
- PRIOR ART -   FIG. 11
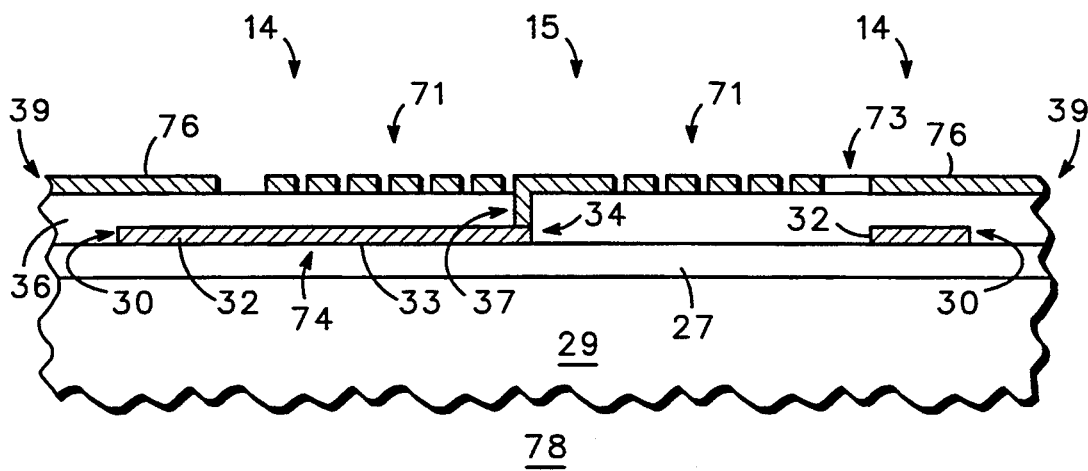
FIG. 12

INTEGRATED CIRCUIT HAVING PASSIVE CIRCUIT ELEMENTS

BACKGROUND OF THE INVENTION

The present invention relates, in general, to integrated circuits, and more particularly, to integrated circuits having inductive and capacitive elements.

Electrical systems are made up of a multitude of components including active elements such as transistors, and passive elements such as capacitors, inductors, and resistors. In an effort to improve electrical system performance, many systems designers attempt to optimize the size, the weight, and the speed of electrical signal propagation through these components. Driven by the size and weight requirements of systems designers, semiconductor device manufacturers have formed integrated circuits by integrating both active and passive circuit elements into a single semiconductor substrate. Although, semiconductor device manufacturers have developed elegant techniques for reducing the sizes of active circuit elements, passive circuit elements such as capacitors and inductors still occupy a large portion of the semiconductor die area.

Accordingly, it would be advantageous to have an integrated circuit comprising inductive and capacitive elements and methods for making such an integrated circuit that results in reducing the die area typically required.

SUMMARY OF THE INVENTION

Briefly stated, the present invention is an integrated circuit comprising a first conductive material and a second conductive material. The second conductive material comprises a first region substantially surrounding a second region. Further, a dielectric material is formed between the first conductive material and the second conductive material.

In another aspect, the present invention is a method of forming an integrated circuit including the steps of forming a first layer of conductive material, and covering a portion of the first layer of conductive material with a layer of dielectric material. Subsequently, the method includes forming a second layer of conductive material on the layer of dielectric material, wherein the second layer of conductive material is patterned to have a first region substantially surrounding a second region, a portion of the second region being electrically coupled to the first layer of conductive material.

BRIEF DESCRIPTION OF THE DRAWINGS

FIG. 11 illustrates a circuit diagram of yet another prior art inductor-capacitor network;

FIG. 12 illustrates a highly enlarged cross-sectional view along section line 12—12 of FIG. 13 of yet another semiconductor die processed in accordance with a fourth embodiment of the present invention;

DETAILED DESCRIPTION OF THE DRAWINGS

Figure 1:
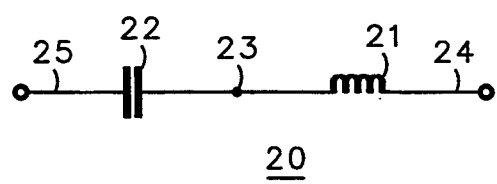
FIG. 1 illustrates a circuit diagram of a prior art two-terminal network.

FIG. 1 illustrates a circuit diagram of a prior art two-terminal passive circuit network 20 comprising an inductor 21 in series with a parallel plate capacitor 22. Network 20 has a first terminal or port 24 formed from a first terminal of inductor 21 and a second terminal or port 25 formed from a second plate of parallel plate capacitor 22. A second terminal of inductor 21 is electrically coupled to a first plate of parallel plate capacitor 22 at node 23.

Figure 2:
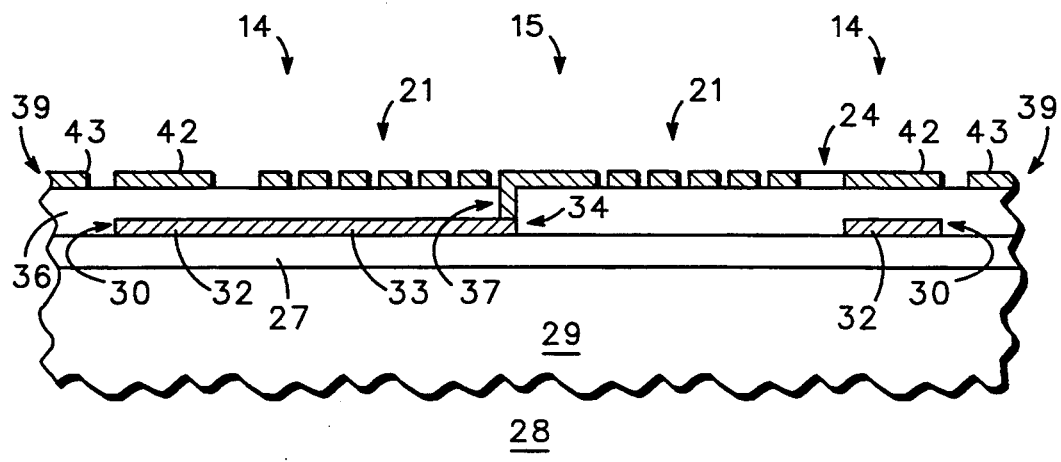
FIG. 2 illustrates a highly enlarged cross-sectional view along section line 2—2 of FIG. 4 of a semiconductor die processed in accordance with a first embodiment of the present invention.
Figure 4:
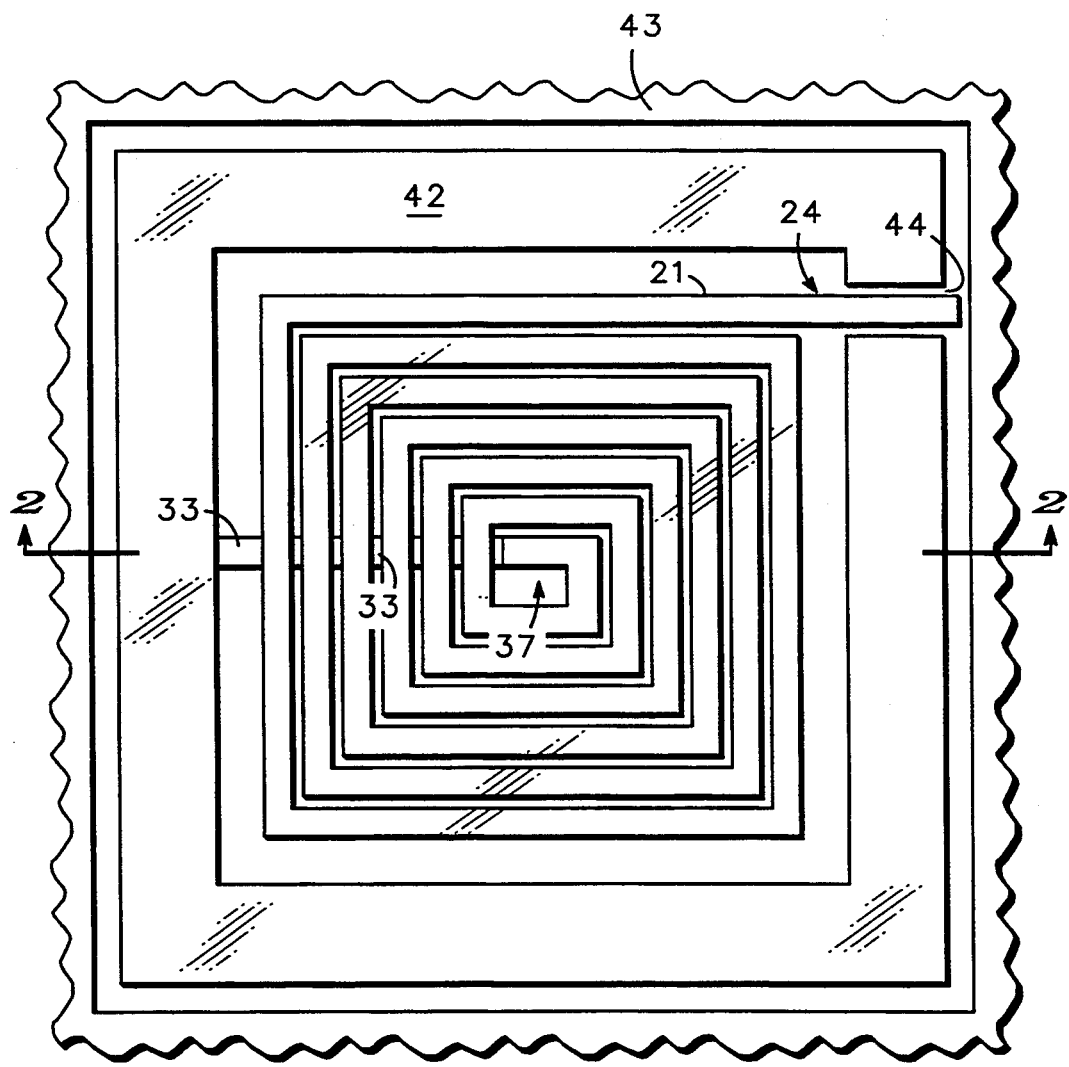
FIG. 4 illustrates a plan view of a portion of the semiconductor die of FIG. 2.

FIG. 2 illustrates a highly enlarged cross-sectional view along section line 2—2 of FIG. 4 of a semiconductor die 28 processed in accordance with the new and novel method of the present invention to form a two-terminal passive circuit network such as network 20 of FIG. 1. It shall be understood that the same reference numerals are used in the figures to denote the same elements. Semiconductor die 28 has a first passive circuit element region 14 substantially surrounding a second passive circuit element region 15. Semiconductor die 28 is comprised of a semiconductor substrate 29 such as, for example, gallium arsenide, silicon, germanium, or the like. Preferably, semiconductor substrate 29 is gallium arsenide. An optional layer of field oxide 27 is formed on semiconductor substrate 29, using techniques well known in the art. Optional layer of field oxide 27 has a thickness ranging between, for example, approximately 0.2 micrometers and approximately 0.4 micrometers. It shall be understood that the thickness of optional layer of field oxide 27 is not a limitation of the present invention. A first layer of conductive material 30, also referred to as a first electrically conductive layer, is formed on layer of field oxide 27 and subsequently patterned to form one plate of parallel plate capacitor 22 (FIG. 1). Layer of conductive material 30 may be aluminum, titanium tungsten, gold, etc. By way of example, layer of conductive material 30 is aluminum having a thickness of approximately 1.0 micrometer. Although layer of conductive material 30 is shown and treated as a single layer of conductive material, it shall be understood that layer of conductive material 30 may be comprised of multiple layers of conductive material, wherein an initial layer of conductive material serves as an ohmic contact layer contacting layer of field oxide 27, or contacting semiconductor substrate 29.

Figure 3:
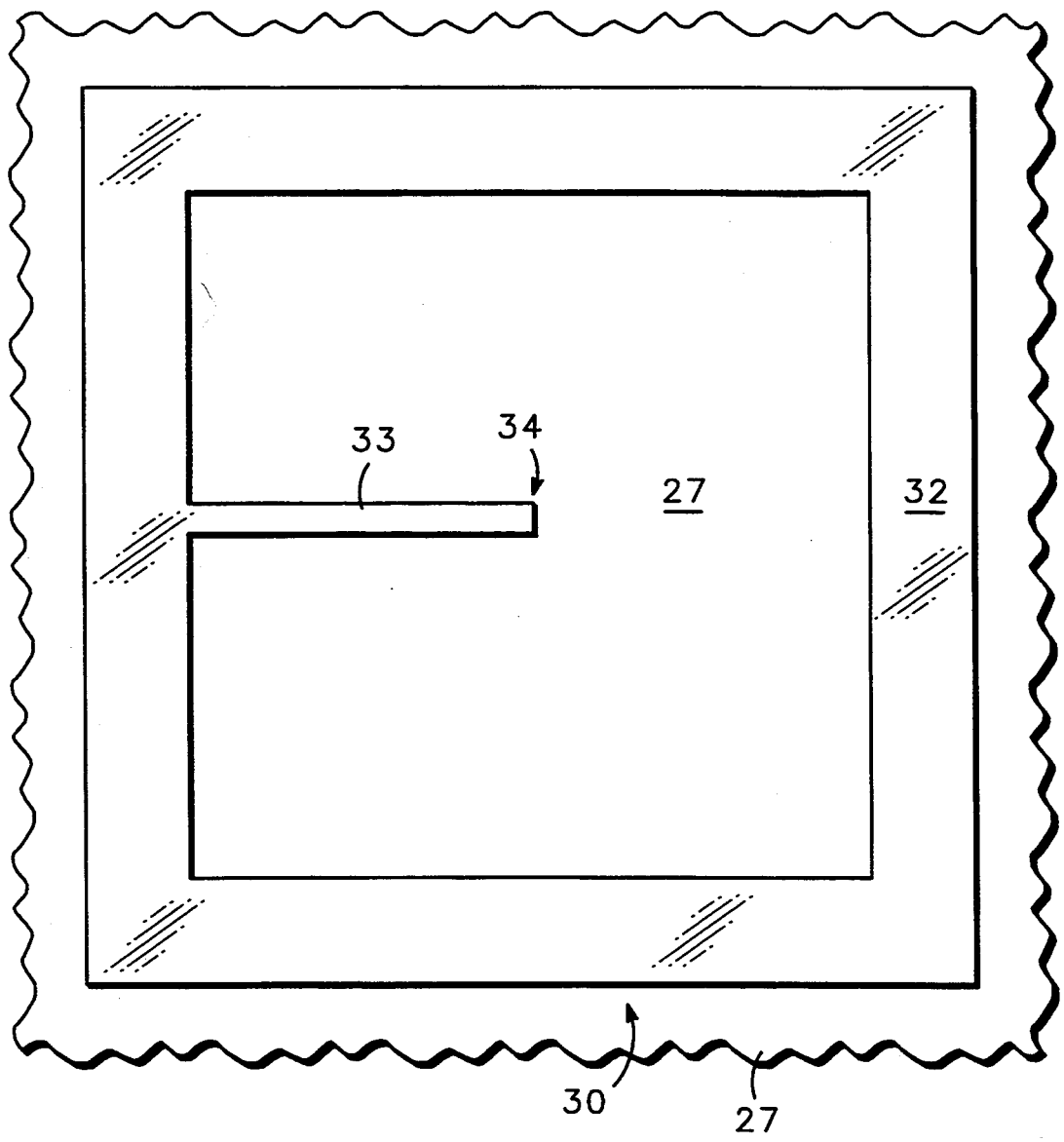
FIG. 3 illustrates a plan view of a portion of the semiconductor die of FIG. 2 during an intermediate processing step.

Referring now to FIG. 3, a plan view of layer of conductive material 30 is shown after layer of conductive material 30 has been patterned on layer of field oxide 27 using techniques well known to those skilled in the art. More particularly, layer of conductive material 30 is patterned to form a rectangularly shaped closed ring structure 32. An electrical interconnect 33 extends from one side of ring structure 32 towards a center of ring structure 32 and terminates at an end 34. Although electrical interconnect 33 is shown as a rectangular shaped structure having end 34 centrally located, it shall be understood that the shape of electrical interconnect 33 and the location of end 34 is not a limitation of the present invention. In other words, electrical interconnect 33 may have any shape suitable for electrically interconnecting an inductor with a parallel plate capacitor. As will be described infra, rectangular shaped closed ring structure 32 serves as a first plate for capacitor 22 shown in FIG. 1.

Referring again to FIG. 2, a layer of dielectric material 36 is formed on layer of conductive material 30. More particularly, layer of dielectric material 36, also referred to as a dielectric layer, is formed on first plate 32, electrical interconnect 33, and exposed portions of layer of field oxide 27. Layer of dielectric material 36 serves as a dielectric material for parallel plate capacitor 22, and may be silicon nitride, silicon dioxide, or the like. By way of example, layer of dielectric material 36 is silicon nitride having a thickness ranging between approximately 0.1 micrometers and approximately 1.0 micrometers. Those skilled in the art will recognize that the value of capacitor 22 is determined at least in part by the type and thickness of the material selected for layer of dielectric material 36. It shall be understood that the thickness range for layer of dielectric material 36 is merely provided as an example and is not a limitation of the thickness of layer of dielectric 36.

A via 37 is formed through layer of dielectric material 36 and exposes end 34 of electrical interconnect 33. Via 37 provides a means for electrically connecting first plate 32 of capacitor 22 with the second terminal of inductor 21. Methods of forming vias such as via 37 are well known to those skilled in the art.

A second layer of conductive material 39, also referred to as a second electrically conductive layer, is formed on layer of dielectric material 36, and exposed portions of layer of conductive material 30. More particularly, second layer of conductive material 39 fills via 37 and contacts end 34 of electrical interconnect 33, thereby coupling electrical interconnect 33 with second layer of conductive material 39, i.e., electrically coupling a first portion of layer of conductive material 30 with a first portion of a second region of layer of conductive material 39. By way of example, second layer of conductive material 39 has a thickness of approximately 2.5 micrometers. Preferably, second layer of conductive material 39 is patterned to form planar spiral inductor 21 in the second region of layer of conductive material 39, second plate 42 of capacitor 22 in the first region of layer of conductive material 39, a first terminal 24 and a conductive plane 43, wherein second plate 42 surrounds planar spiral inductor 21. As those skilled in the art will appreciate, first terminal 24 is illustrated because it typically can be seen through the layer of dielectric material 36. Methods for patterning layers of conductive material are well known to those skilled in the art.

Referring now to FIG. 4, a plan view of layer of conductive material 39 is shown after layer of conductive material 39 has been patterned. More particularly, the plan view illustrates spiral inductor 21, second plate 42 of capacitor 22, electrical interconnect 33, conductive plane 43, and first terminal 24. Second layer of conductive material 39 fills via 37 (FIG. 2) and contacts electrical interconnect 33, thereby electrically connecting inductor 21 with first plate 32 of capacitor 22. As those skilled in the art will recognize, electrical interconnect 33 functions electrically as a portion of spiral inductor 21, i.e., electrical interconnect 33 is part of inductor 21. Moreover, electrical interconnect 33 is typically visible through the layer of dielectric material 36 and is therefore illustrated. Further, the spirals of spiral inductor 21 spiral in a rectangular shape, i.e., spiral inductor 21 is a rectangular shaped planar spiral inductor. To aid in understanding the structure and electrical connections forming network 20, the location of via 37 is indicated by an arrow labeled with the reference numeral of via 37.

Further, second plate 42 is a rectangularly shaped ring structure having a shape which preferably corresponds to first plate 32, wherein second plate 42 is preferably above and vertically spaced apart from first plate 32 by a portion of layer of dielectric material 36. In one embodiment, second plate 42 is an open ring structure having a gap 44 through which first terminal 24 of network 20 extends. Thus, first plate 32 and second plate 42 having layer of dielectric material 36 therebetween form parallel plate capacitor 22 (FIG. 1). Although second plate 42 is shown as having gap 44, it shall be understood that second plate 42 may be a closed ring structure not having gap 44. It shall be further understood that second plate 42 serves as second terminal 25 of network 20 (FIG. 1). As those skilled in the art are well aware, layer of conductive material 39 may be patterned such that second terminal 25 (FIG. 1) extends from second plate 42.

Figure 5:
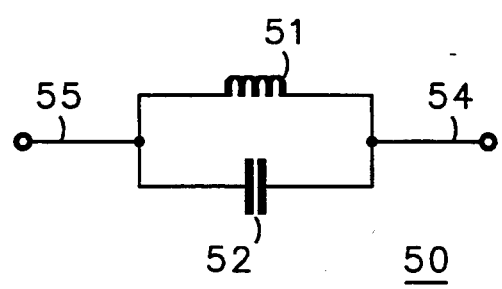
FIG. 5 illustrates a circuit diagram of a prior art inductor-capacitor network.
Figure 6:
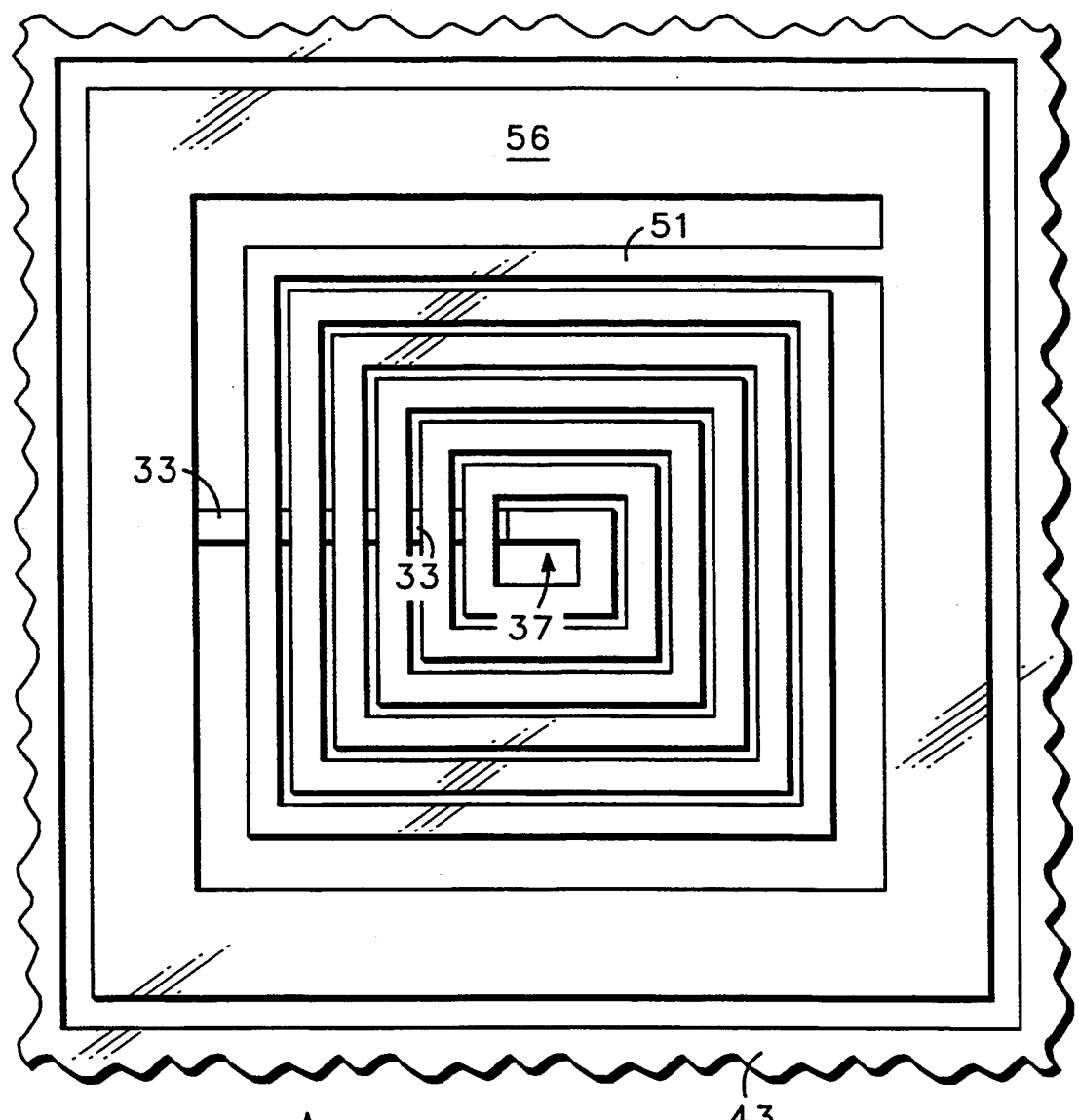
FIG. 6 illustrates a plan view of a portion of an embodiment of a semiconductor die used in the formation of the network of FIG. 5 in accordance with a second embodiment of the present invention.

FIG. 5 illustrates a circuit diagram of a prior art inductor-capacitor network 50 having an inductor 51 in parallel with a capacitor 52, wherein parallel inductor-capacitor network 50 has a first terminal 54 and a second terminal 55. Network 50 is formed using the same techniques used for forming network 20 of FIG. 1 and shown in FIGS. 2-4, wherein the difference between the methods of forming network 20 and network 50 is the pattern of second layer of conductive material 39. Accordingly, a cross-sectional view of network 50 is identical to the cross-sectional view of network 20 shown in FIG. 2, with the exception of the pattern for second layer of conductive material 39. In other words, network 50 is realized by using the structure illustrated in FIG. 2, wherein patterned second layer of conductive material 39 of FIG. 2 is replaced by the layer of conductive material 39 having the pattern as illustrated in FIG. 6. By way of example, second layer of conductive material 39 has a thickness of approximately 2.5 micrometers.

Referring now to FIG. 6, a plan view of a patterned second layer of conductive material 39 is illustrated, wherein second layer of conductive material 39 has been patterned using techniques well known in the art. More particularly, the plan view illustrates a spiral inductor 51, second plate 56, electrical interconnect 33, and conductive plane 43 in accordance with the present invention. Similar to the structure shown in FIG. 2, second layer of conductive material 39 fills via 37, thereby contacting electrical interconnect 33 and electrically connecting inductor 51 with first plate 32 (shown in FIGS. 2 and 3) of capacitor 52 (FIG. 5). To aid in understanding the structure and electrical connections forming network 50, the location of via 37 is indicated by an arrow labeled with the reference numeral of via 37.

Second plate 56 is a rectangular closed ring structure having a shape corresponding to first plate 32, wherein second plate 56 is above and vertically spaced apart from first plate 32 by a portion of layer of dielectric material 36. Second layer of conductive material 39 is patterned such that a first terminal of spiral inductor 51 is electrically connected to second plate 56. In other words, a first terminal of spiral inductor 51 and a portion of second plate 56 are formed from the same portion of second layer of conductive material 39. Thus, parallel inductor-capacitor network 50 is formed by electrically coupling a second terminal of inductor 51 to first plate 32 of capacitor 52, and electrically coupling second plate 56 of capacitor 52 to a first terminal of spiral inductor 51. Second plate 56 serves as first terminal 54 of network 50 and first plate 32 serves as second terminal 55 of network 50, as shown in FIG. 5.

Figure 7:
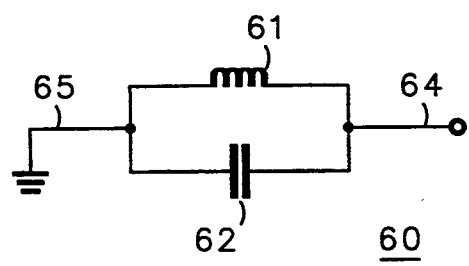
FIG. 7 illustrates a circuit diagram of another prior art inductor-capacitor network.
Figure 8:
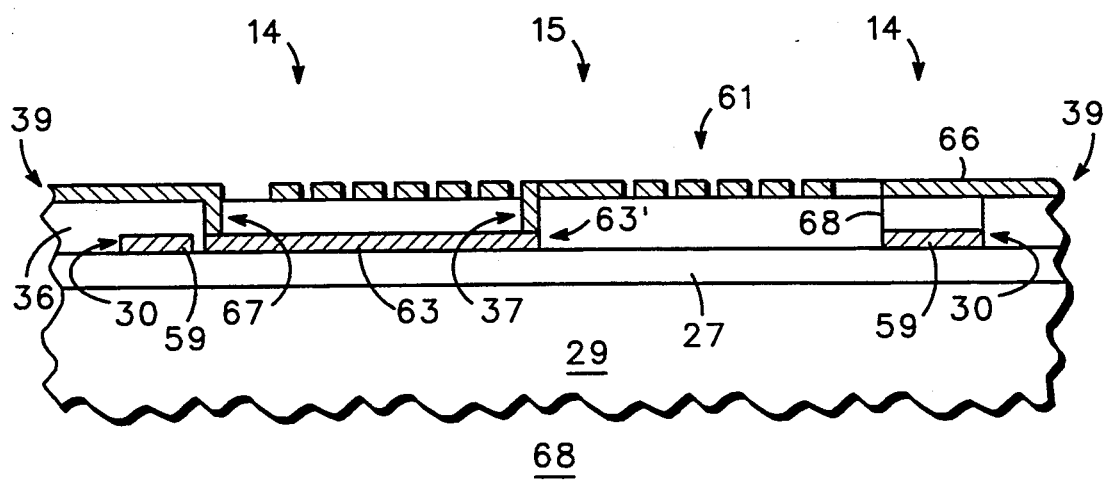
FIG. 8 illustrates a highly enlarged cross-sectional view along section line 8—8 of FIG. 10 of another semiconductor die processed in accordance with a third embodiment of the present invention.

FIG. 7 illustrates a circuit diagram of a prior art inductor-capacitor network 60 having an inductor 61 in parallel with a capacitor 62, wherein parallel inductor-capacitor network 60 has a first terminal 64 and a second terminal 65. Second terminal 65 is coupled to a ground potential, i.e., second terminal 65 is grounded or shorted to a ground potential. A highly enlarged cross-sectional view, along section line 8—8, of a semiconductor die 68 processed in accordance with the method of the present invention is illustrated in FIG. 8. Semiconductor die 68 has a first passive circuit element region 14 surrounding a second passive circuit element region 15 and is comprised of a semiconductor substrate 29 having a layer of field oxide 27 and a first layer of conductive material 30, wherein semiconductor substrate 29 and layer of field oxide 27 are the same as discussed in the description of FIG. 2.

Figure 9:
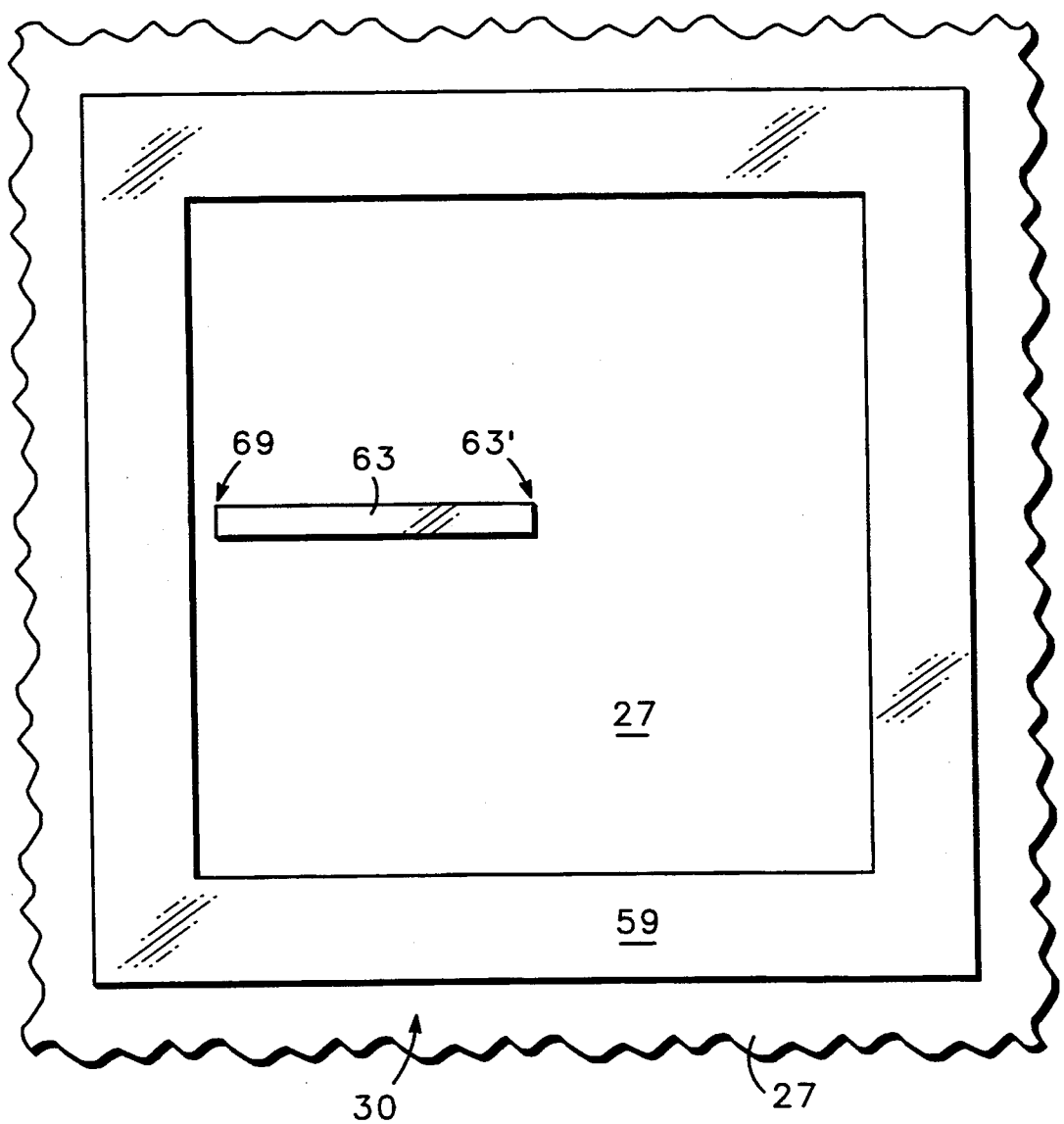
FIG. 9 illustrates a plan view of a portion of the semiconductor die of FIG. 8 during an intermediate processing step.

Referring now to FIG. 9, a plan view of layer of conductive material 30 is shown after layer of conductive material 30 has been patterned on layer of field oxide 27. Layer of conductive material 30 is patterned to form a closed ring structure 59 having a rectangular shape or pattern. Ring structure 59 surrounds and is electrically isolated from an electrical interconnect 63 and has a first end 63' and a second end 69. Although electrical interconnect 63 is shown as a rectangular shaped structure, it shall be understood that the shape of electrical interconnect 63 is not a limitation of the present invention, and that electrical interconnect 63 may have any shape suitable for electrically interconnecting a spiral inductor with a parallel plate capacitor. Rectangular shaped closed ring structure 59 serves as a first plate for capacitor 62 shown in FIG. 7.

Referring again to FIG. 8, a layer of dielectric material 36 is formed on layer of conductive material 30. Formation of layer of dielectric material 36 is discussed with respect to FIG. 2. A first via 37 is formed through layer of dielectric material 36 and exposes first end 63' of electrical interconnect 63. A via 67 is formed through layer of dielectric material 36 and exposes second end 69 of electrical interconnect 63. A via 68 is formed through layer of dielectric material 36 and exposes a portion of first plate 59 of capacitor 62.

A second layer of conductive material 39 is formed on layer of dielectric material 36, ends 63' and 69 of electrical interconnect 63, and the exposed portion of first plate 59 of capacitor 62. More particularly, second layer of conductive material 39 fills vias 37, 67, and 68. Via 68 provides a means for electrically connecting first plate 59 of capacitor 62 with the second terminal of spiral inductor 61. By way of example, second layer of conductive material 39 has a thickness of approximately 2.5 micrometers. Second layer of conductive material 39 is patterned to form spiral inductor 61 and second plate 66 of capacitor 62 of FIG. 7.

Figure 10:
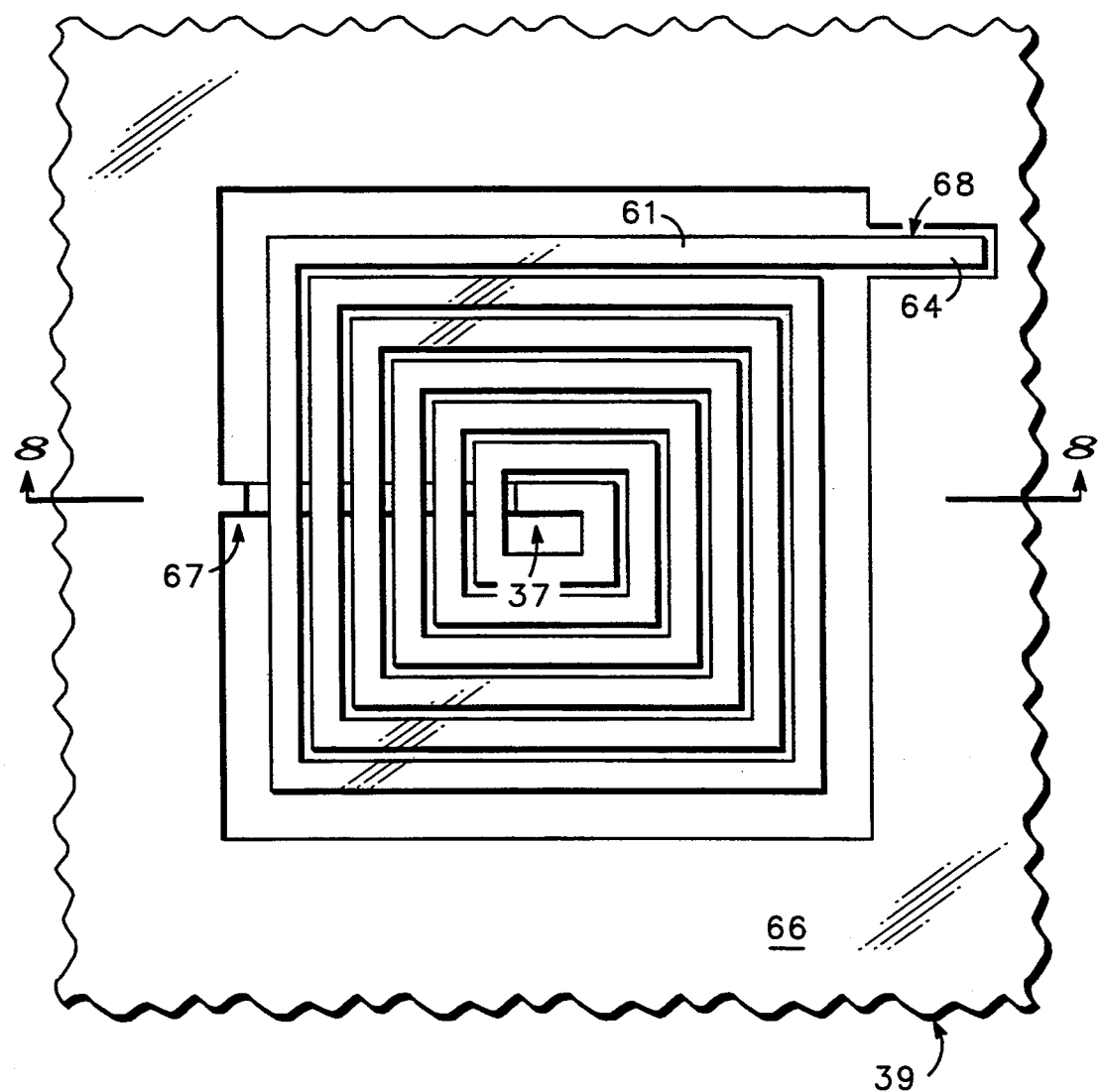
FIG. 10 illustrates a plan view of a portion of the semiconductor die of FIG. 8.

Referring now to FIG. 10, a plan view of layer of conductive material 39 is shown after second layer of conductive material 39 has been patterned. More particularly, the plan view illustrates spiral inductor 61 and the second plate 66 of capacitor 62. To aid in understanding the structure and electrical connections forming network 60, the location of vias 37, 67, and 68 are indicated by arrows labeled with the respective reference numerals of vias 37, 67, and 68. Second layer of conductive material 39 fills vias 37 and 67, thereby electrically coupling a second terminal of spiral inductor 61 to second plate 66 of capacitor 62 through electrical interconnect 63. Coupling the second terminal of spiral inductor 61 to second plate 66 of capacitor 62 forms the circuit equivalent of second terminal 65 of network 60 shown in FIG. 7. Further, second plate 66 is part of a conductive plane formed by a portion of second layer of conductive material 39 that is electrically isolated from spiral inductor 61. In accordance with network 60 of FIG. 7, second plate 66, and hence the conductive plane, is coupled to a ground potential. In other words, second terminal 65 of network 60 is grounded.

In addition, second layer of conductive material 39 fills via 68, thereby electrically connecting a first terminal of spiral inductor 61 to first plate 59 of capacitor 62. Connecting the first terminal of spiral inductor 61 to first plate 59 of capacitor 62 forms the circuit equivalent of first terminal 64 of network 60 illustrated in FIG. 7.

FIG. 11 illustrates a circuit diagram of a prior art inductor-capacitor network 70 comprising an inductor 71 connected to a parallel plate capacitor 72. Network 70 has a first terminal or port 73 formed from a first terminal of inductor 71, a second terminal or port 74 formed at a node connecting a first plate of parallel plate capacitor 72 to a second terminal of inductor 71, and a third terminal or port 75 formed from a second plate of parallel plate capacitor 72. Third terminal 75 is coupled to a ground potential.

A highly enlarged cross-sectional view (along section line 12—12 of FIG. 13) of a semiconductor die 78 processed in accordance with the present invention is illustrated in FIG. 12. Semiconductor die 78 has a first passive circuit element region 14 surrounding a second passive circuit element region 15 and is comprised of a semiconductor substrate 29 such as, for example, gallium arsenide, silicon, germanium, or the like. Semiconductor die 78 has a layer of field oxide 27 on semiconductor substrate 29, a first layer of conductive material 30, a layer of dielectric material 36, and a via 37, wherein semiconductor substrate 29, layer of field oxide 27, layer of conductive material 30, layer of dielectric material 36, and via 37 are the same as discussed with reference to FIGS. 3 and 4.

Still referring to FIG. 12, a second layer of conductive material 39 is formed on layer of dielectric material 36 and end 34 of electrical interconnect 33. Second layer of conductive material 39 has, for example, a thickness of approximately 2.5 micrometers. Second layer of conductive material 39 fills via 37, wherein via 37 provides means for electrically connecting first plate 32 of capacitor 72 with the second terminal of inductor 71. Second layer of conductive material 39 is patterned to form spiral inductor 71, second plate 76 of parallel plate capacitor 72, and a first terminal 74 of network 70.

Figure 13:
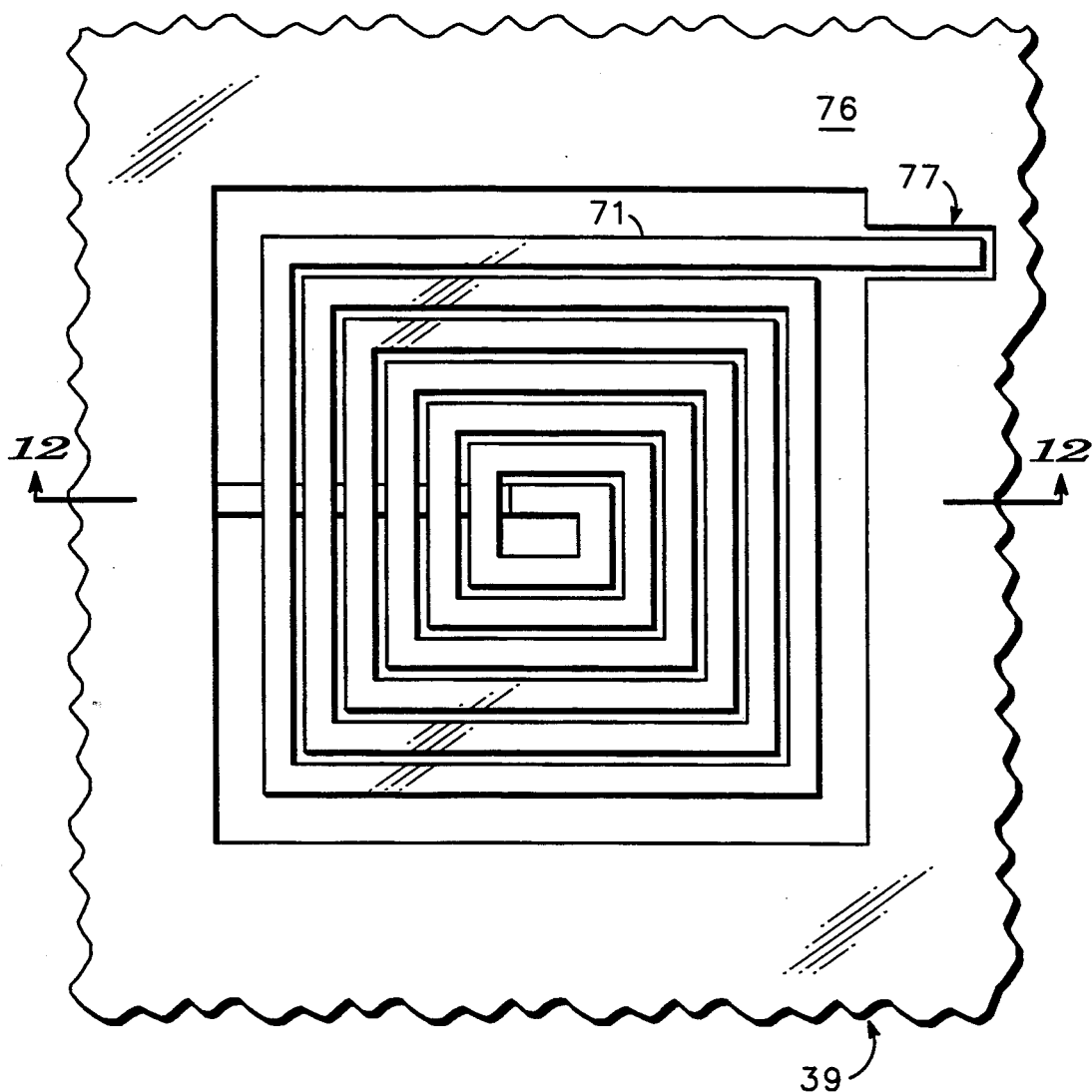
FIG. 13 illustrates a plan view of a step in the processing of the semiconductor die of FIG. 12.

Referring now to FIG. 13, a plan view of layer of conductive material 39 is shown after layer of conductive material 39 has been patterned using techniques well known to those skilled in the art. The plan view illustrates spiral inductor 71 and second plate 76 of parallel plate capacitor 72 (FIG. 11). In one embodiment, second plate 76 is an open ring structure having a gap 77 through which first terminal 74 of network 70 extends. Thus, first plate 32 and second plate 76 have layer of dielectric material 36 therebetween and form parallel plate capacitor 72 (FIG. 11). Further, second plate 76 is part of a conductive plane formed by a portion of second layer of conductive material 39 that is electrically isolated from spiral inductor 71. In accordance with network 70 of FIG. 11, second plate 76, and hence the conductive plane are coupled to a ground potential. Although second plate 76 of parallel plate capacitor 72 is shown as having gap 77, it shall be understood that second plate 76 may be a closed ring structure not having gap 77.

Figure 14:
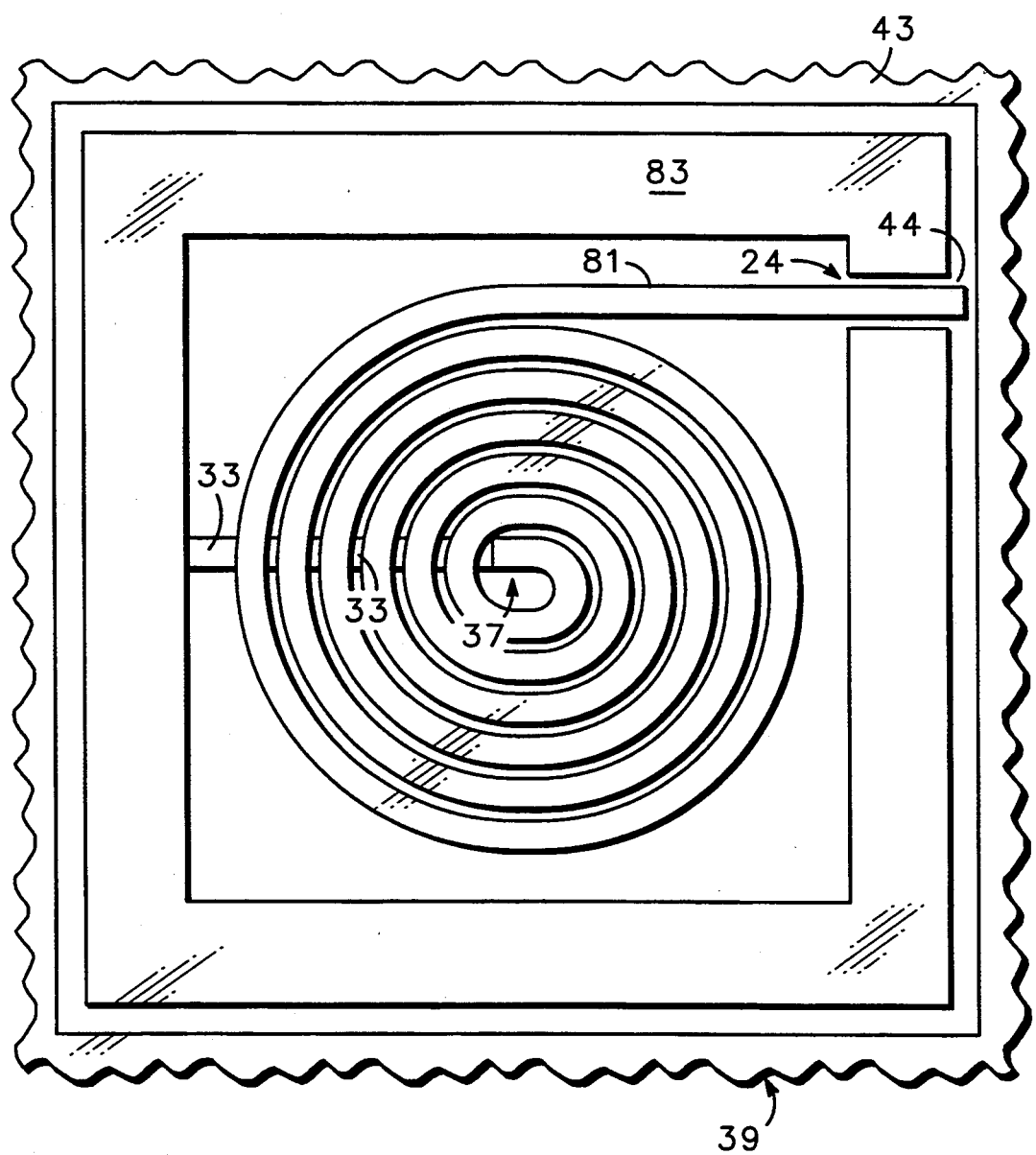
FIG. 14 illustrates a plan view of a circularly shaped spiral inductor in accordance with a fifth embodiment of the present invention.

FIG. 14 illustrates a plan view of layer of conductive material 39, wherein layer of conductive material 39 has been patterned. The plan view illustrates a circular shaped planar spiral inductor 81 and a first plate 83 of a parallel plate capacitor. More particularly, planar spiral inductor 81 is a circular shaped spiral inductor. Although first plate 83 is shown as having a rectangular shape, it will be understood by those skilled in the art that first plate 83, as well as a second plate (not shown) may have a circular shape, or a polygonal shape.

Figure 15:
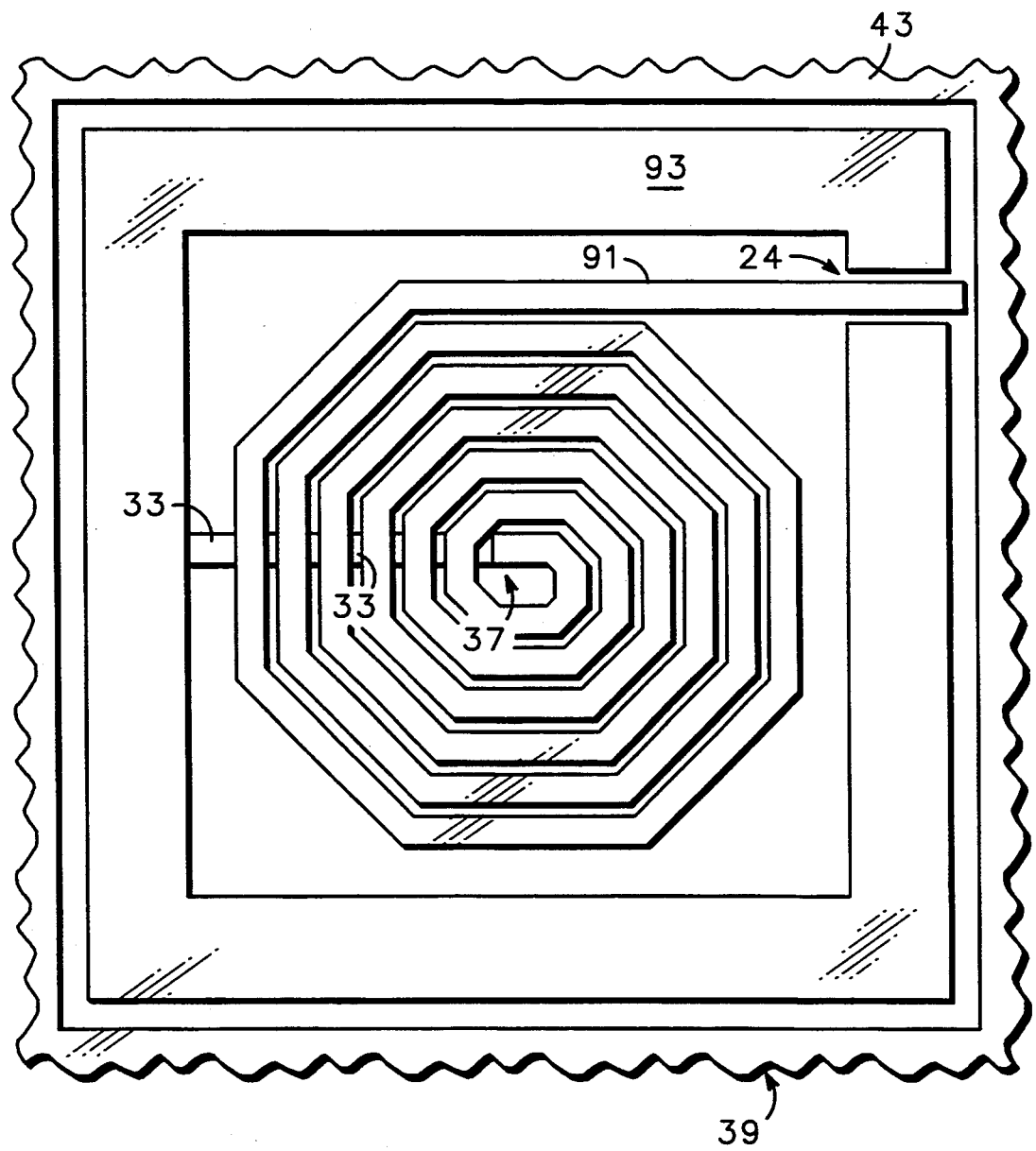
FIG. 15 illustrates a plan view of an octagonally shaped spiral inductor in accordance with a sixth embodiment of the present invention.

FIG. 15 illustrates a plan view of layer of conductive material 39, wherein layer of conductive material 39 is patterned such that a planar spiral inductor 91 has an octagonal shape. In other words, spiral inductor 91 is an octagonal shaped spiral inductor. Second layer of conductive material 39 is further patterned to form a first plate 93 of a parallel plate capacitor (not shown). Similar to first plate 83 of FIG. 14, first plate 93 may have a circular shape or a polygonal shape such as an octagon.

By now it should be appreciated that a new and novel structure and method for forming an integrated circuit having an inductor-capacitor network has been described. The inductor-capacitor network is a passive circuit structure formed from two layers of conductive material separated by a layer of dielectric material. The second layer of conductive material has a first passive circuit element region 14 surrounding a second passive circuit element region 15, wherein second passive circuit element region 15 has a first terminal and a second terminal. Further, first passive circuit element region 14 cooperates with second passive circuit element region 15 and the first layer of conductive material to form a passive electrical network.

In one embodiment, the second passive circuit element region comprises a planar spiral inductor and the second passive circuit element region comprises two parallel ring structures that form a capacitor. Placing the spiral inductor within two parallel ring structures that serve as a capacitor, provides a means of realizing the inductor-capacitor network using less semiconductor die area than the conventional approach of forming the capacitor from solid plates and placing the inductor beside the solid plate. Although the inductor-capacitor network of the present invention includes a planar spiral inductor, the inductor-capacitor network is a relatively planar structure. In other words, the thickness of the inductor-capacitor structure (approximately 30 micrometers) is small relative to the thickness of the semiconductor substrate and the field oxide, combined (approximately 626 micrometers), and thus the inductor-capacitor structure is essentially planar.

As those skilled in the art are well aware, the spiral inductor may be formed in either the first or the second layer of conductive material. Further, either plate of the parallel plate capacitor may be set at a ground potential or serve as a conductive layer.

We claim:

1. An integrated circuit, comprising:
   a capacitor comprising first and second electrically conductive layers having a dielectric layer disposed therebetween; and
   an inductor formed on the dielectric layer and substantially surrounded by the second electrically conductive layer.

2. An integrated circuit as claimed in claim 1, wherein the inductor is a circular shaped planar spiral inductor.

3. An integrated circuit as claimed in claim 1, wherein the inductor is a rectangular shaped planar spiral inductor.

4. An integrated circuit as claimed in claim 1, wherein the inductor has a first terminal electrically coupled to the second electrically conductive layer.

5. An integrated circuit as claimed in claim 4, wherein the inductor has a second terminal electrically coupled to the first electrically conductive layer.

6. An integrated circuit as claimed in claim 1, wherein the inductor has a first terminal electrically coupled to the first electrically conductive layer.

7. An integrated circuit as claimed in claim 1, wherein the second electrically conductive layer is shorted to a ground potential.

* * * * *